(12) United States Patent
Tanaka

(10) Patent No.: US 12,412,876 B2
(45) Date of Patent: Sep. 9, 2025

(54) SEMICONDUCTOR PACKAGE

(71) Applicant: Panasonic Intellectual Property Management Co., Ltd., Osaka (JP)

(72) Inventor: Kazuhito Tanaka, Shiga (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 453 days.

(21) Appl. No.: 18/162,489

(22) Filed: Jan. 31, 2023

(65) Prior Publication Data

US 2023/0253382 A1 Aug. 10, 2023

(30) Foreign Application Priority Data

Feb. 8, 2022 (JP) ................. 2022-018028

(51) Int. Cl.
*H01L 25/16* (2023.01)
*H01L 23/00* (2006.01)

(52) U.S. Cl.
CPC .............. *H01L 25/16* (2013.01); *H01L 24/48* (2013.01); *H01L 2224/4814* (2013.01); *H01L 2924/1432* (2013.01); *H01L 2924/1436* (2013.01); *H01L 2924/19043* (2013.01); *H01L 2924/19107* (2013.01)

(58) Field of Classification Search
CPC . H01L 25/16; H01L 24/48; H01L 2924/1432; H01L 2924/1436; H01L 2924/19043
See application file for complete search history.

(56) References Cited

U.S. PATENT DOCUMENTS 6,262,902 B1 7/2001 Watanabe et al.
2017/0303400 A1* 10/2017 Frenette ................. H10N 30/30

FOREIGN PATENT DOCUMENTS

JP 2000174202 A 6/2000

\* cited by examiner

*Primary Examiner* — Walter H Swanson
(74) *Attorney, Agent, or Firm* — Seed Intellectual Property Law Group LLP

(57) ABSTRACT

A semiconductor package according to the present disclosure includes: a plurality of semiconductor chips that include a system on chip (SoC) in which a plurality of integrated circuits including a processor core and a microcomputer are integrated on a single chip; a power management integrated circuit (IC) for performing power management on the plurality of semiconductor chips; a plurality of shunt resistors each of which is mounted in series on a different one of power wires connecting the power management IC and the plurality of semiconductor chips; two output terminals; and a single selector that outputs voltages at both ends of a shunt resistor to an outside via the two output terminals, the shunt resistor being selected from among the plurality of shunt resistors. The power management IC, the plurality of semiconductor chips, the plurality of shunt resistors, and the single selector are mounted inside a single package.

6 Claims, 4 Drawing Sheets

SEMICONDUCTOR PACKAGE

CROSS REFERENCE TO RELATED APPLICATION

The present application is based on and claims priority of Japanese Patent Application No. 2022-018028 filed on Feb. 8, 2022.

FIELD

The present disclosure relates to a semiconductor package.

BACKGROUND

Systems on chip (SoCs) in which integrated circuits having different functions such as processor cores and microcomputers are integrated on a chip are known and increasingly mounted on automobile vehicles.

In such automotive SoCs, since thermal design is required in order to achieve operation in automobile vehicles, power measurement is performed at the time of operation.

In recent years, the performance of automotive SoCs has been enhanced such as an increase in the number of connection channels of integrated circuits or an increase in the number of channels of various interfaces, and the number of physical inputs/outputs (IOs) has increased. In order to increase the number of IOs, it is necessary to enlarge a package (also referred to as an SoC package) containing an SoC, that is, a chip on which integrated circuits are integrated, or to narrow ball pitches of the SoC package.

However, it is unrealistic to enlarge the SoC package in terms of cost etc. Moreover, narrowing the ball pitches of the SoC package not only makes substrate mounting difficult but also leads to the deterioration of quality and life span of electronic components after substrate mounting.

In response, there is a technique for incorporating chips into a package, and there is a tendency to apply this technique. A semiconductor package formed using such a technique is referred to as a system in package (SiP).

In a SiP in which semiconductor chips are incorporated into a package, it is possible to mount the semiconductor chips within the SiP, and make wires between the semiconductor chips with a substrate inside the SiP.

Here, it is possible to reduce the number of IOs of the SiP itself by mounting an SoC, a power management IC, dynamic random-access memory (DRAM), etc. within the SiP, and making power wires and signal wires with the substrate inside the SiP. Additionally, in the SiP, it is possible to make wires for 4 Gbps class high-speed signals short and decrease the drive capability of an output buffer for high-speed signal, by shortening a distance between the SoC and the DRAM to the limits.

For example, Patent Literature (PTL) 1 discloses a technique for causing a module (IPM) in which a package includes a power element, a drive circuit, and a protection circuit to further include a shunt resistor inserted in series into an output line of the IPM. According to this disclosure, it is possible to monitor an output current flowing through motor M while achieving space saving.

CITATION LIST

Patent Literature

PTL 1: Japanese Unexamined Patent Application Publication No. 2000-174202

SUMMARY

However, the semiconductor package of PTL 1 has room for improvement. In view of this, the present disclosure provides a semiconductor package capable of further improvement.

In order to achieve the above object, a semiconductor package according to one aspect of the present disclosure includes: a plurality of semiconductor chips that include a system on chip (SoC) in which a plurality of integrated circuits including a processor core and a microcomputer are integrated on a single chip; a power management integrated circuit (IC) for performing power management on the plurality of semiconductor chips; a plurality of shunt resistors each of which is mounted in series on a different one of power wires connecting the power management IC and the plurality of semiconductor chips; two output terminals; and a single selector that outputs voltages at both ends of a shunt resistor to an outside via the two output terminals, the shunt resistor being selected from among the plurality of shunt resistors, wherein the power management IC, the plurality of semiconductor chips, the plurality of shunt resistors, and the single selector are mounted inside a single package.

The semiconductor package according to one aspect of the present disclosure is capable of further improvement. According to the present disclosure, it is possible to achieve the semiconductor package capable of measuring consumed power of the SoC while minimizing consumed power of a circuit for power measurement.

BRIEF DESCRIPTION OF DRAWINGS

These and other advantages and features of the present disclosure will become apparent from the following description thereof taken in conjunction with the accompanying drawings that illustrate a specific embodiment of the present disclosure.

Figure 1:
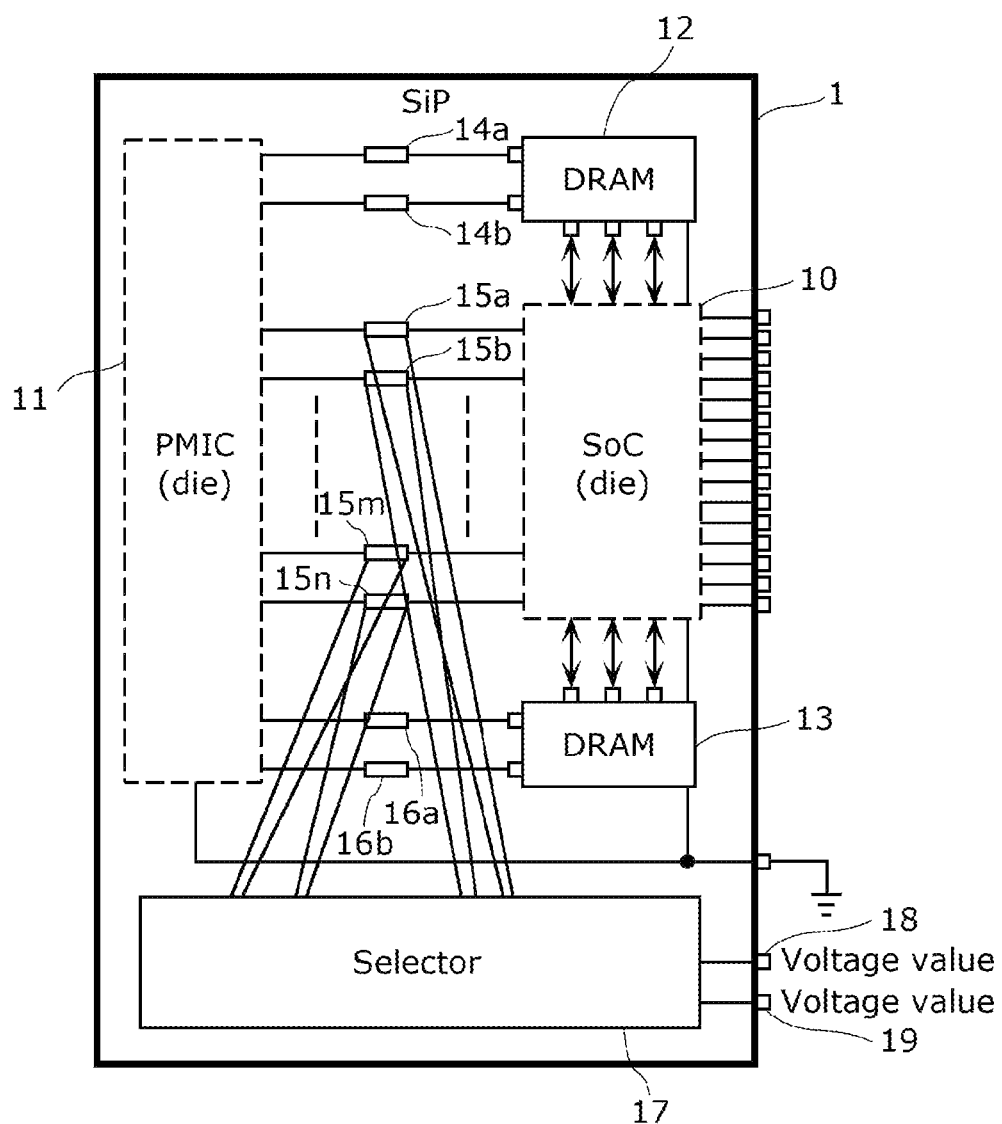
FIG. 1 is a diagram illustrating an example of a configuration of a semiconductor package according to an embodiment.

DESCRIPTION OF EMBODIMENT (Underlying Knowledge Forming Basis of the Present Disclosure)

The inventor discovered that the semiconductor package of PTL 1 described above in the "Background" section has the following problems. Since there are several tens of power wires between the SoC and the power management IC, in order to perform power measurement when the SoC is operating, it is necessary to mount a shunt resistor for current detection in series on each of the power wires, and calculate total consumed power of the power wires by calculating a current at each of the shunt resistors. Moreover, since the power wires between the SoC and the power management IC are enclosed within the SiP due to system-in-packaging (SiP), merely mounting a shunt resistor for current detection in series on each power wire extended to the outside of the SiP does not make it possible to perform power measurement when the SoC is operating.

In order to solve such problems, a semiconductor package according to one aspect of the present disclosure includes: a plurality of semiconductor chips that include a system on chip (SoC) in which a plurality of integrated circuits including a processor core and a microcomputer are integrated on a single chip; a power management integrated circuit (IC) for performing power management on the plurality of semiconductor chips; a plurality of shunt resistors each of which is mounted in series on a different one of power wires connecting the power management IC and the plurality of semiconductor chips; two output terminals; and a single selector that outputs voltages at both ends of a shunt resistor to an outside via the two output terminals, the shunt resistor being selected from among the plurality of shunt resistors. The power management IC, the plurality of semiconductor chips, the plurality of shunt resistors, and the single selector are mounted inside a single package.

As described above, by including the selector and the shunt resistors that consume less power as circuits for power measurement, it is possible to sequentially select and output the voltages at the both ends of the shunt resistor.

Accordingly, it is possible to measure the consumed power of the SoC while minimizing the consumed power of the circuit for power measurement.

Moreover, for example, the single selector may output a voltage difference between the both ends of the shunt resistor selected and a voltage on a power management IC side to the outside via the two output terminals, the voltage on the power management IC side being, among the voltages at the both ends of the shunt resistor, a voltage of the power management IC that is supplied to a power wire on which the shunt resistor selected is mounted.

More specifically, for example, the semiconductor package includes a subtracting circuit that is mounted between the single selector and a first output terminal to which the voltage difference is outputted, the first output terminal being one of the two output terminals. The single selector may output the voltage on the power management IC side to a second output terminal that is a remaining one of the two output terminals and is different from the first output terminal; and may output the voltage difference to the first output terminal by outputting, to the subtracting circuit, a voltage on a semiconductor chip side among the voltages at the both ends of the shunt resistor selected. The subtracting circuit may calculate the voltage difference by subtracting the voltage on the semiconductor chip side from the voltage on the power management IC side.

Accordingly, it is possible to measure the consumed power of the SoC while minimizing the consumed power of the circuit for power measurement. In addition, compared to a case in which voltages at the both ends of a shunt resistor are outputted, since noise is suppressed due to output of a voltage difference at a low voltage, it is possible to measure the consumed power of the SoC accurately.

Furthermore, for example, the single selector may output, to the outside via the two output terminals, a voltage on a power management IC side and a voltage obtained by amplifying a voltage difference between the both ends of the shunt resistor selected, the voltage on the power management IC side being, among the voltages at the both ends of the shunt resistor, a voltage of the power management IC that is supplied to a power wire on which the shunt resistor selected is mounted.

More specifically, for example, the semiconductor package includes a subtracting circuit and an amplifier circuit that are mounted between the single selector and a first output terminal to which the voltage obtained by amplifying the voltage difference is outputted, the first output terminal being one of the two output terminals. The single selector may output the voltage on the power management IC side to a second output terminal that is a remaining one of the two output terminals and is different from the first output terminal; and may output the voltage obtained by amplifying the voltage difference by outputting, to the subtracting circuit, a voltage on a semiconductor chip side among the voltages at the both ends of the shunt resistor selected. The subtracting circuit may calculate the voltage difference by subtracting the voltage on the semiconductor chip side from the voltage on the power management IC side. The amplifier circuit may amplify the voltage difference calculated by the subtracting circuit, and outputs the voltage difference amplified to the first output terminal.

Accordingly, it is possible to measure the consumed power of the SoC while minimizing the consumed power of the circuit for power measurement. In addition, compared to a case in which voltages at the both ends of a shunt resistor are outputted, since not only noise is suppressed but also a small value obtained as a result of taking a difference as measures against noise is amplified and outputted, it is possible to measure the consumed power of the SoC accurately.

Moreover, for example, the plurality of semiconductor chips may include a dynamic random-access memory (DRAM).

Hereinafter, exemplary embodiments will be described in detail with reference to the drawings. It should be noted that each of the exemplary embodiments described below shows a general or specific example. Numerical values, shapes, materials, constituent elements, the arrangement and connection of the constituent elements, steps, and the order of steps, etc. are mere examples, and are not intended to limit the scope of the present disclosure. Moreover, among the constituent elements in the following exemplary embodiment, constituent elements not recited in any one of the independent claims that indicate the broadest concepts are described as arbitrary constituent elements. Furthermore, the respective figures are schematic diagrams and are not necessarily precise illustrations. Additionally, in the respective figures, the same reference signs are assigned to the same constituent components.

Embodiment

Hereinafter, a semiconductor package according to an embodiment will be described with reference to the drawings.

[Configuration]

FIG. 1 is a diagram illustrating an example of a configuration of semiconductor package 1 according to the embodiment.

Although semiconductor package 1 is referred to as, for example, a SiP or a SiP module, semiconductor package 1 is not limited to the name "SiP" and may enable integration of semiconductor chips into a single package. Semiconductor package 1 according to the present embodiment is manufactured typically for in-vehicle use.

As shown in FIG. 1, semiconductor package 1 according to the present embodiment includes SoC 10, PMIC 11, DRAM 12, DRAM 13, shunt resistors 14a to 16b, selector 17, and two output terminals 18 and 19. Semiconductor package 1 is obtained by mounting SoC 10, PMIC 11, DRAM 12, DRAM 13, shunt resistors 14a to 16b, and selector 17 on a substrate in a single package and sealing the single package.

SoC 10 is a system on chip (SoC) in which integrated circuits including a processor core and a microcomputer are integrated on a single chip, and corresponds to one of semiconductor chips. An SoC is obtained by mounting, on a single semiconductor chip, integrated circuits having various functions of a processor, a microcomputer, and others as functions necessary for operations of an intended system. In addition, the SoC alone functions as a system. In the present embodiment, SoC 10 is contained as a bare chip in semiconductor package 1.

PMIC 11 is a power management IC for performing power management on the semiconductor chips. PMIC stands for Power Management Integrated Circuit and refers to an integrated circuit in which power rails and a power management (power control) function are contained in a single chip. In the present embodiment, as shown in FIG. 1, PMIC 11 is connected to SoC 10 by several tens of power wires and signal wires, and connected to DRAMs 12 and 13 by power wires. PMIC 11 is grounded as shown in FIG. 1. Moreover, in the present embodiment, PMIC 11 is contained as a bare chip in semiconductor package 1.

DRAM 12 and DRAM 13 each correspond to one of the semiconductor chips. In the present embodiment, DRAM 12 and DRAM 13 are connected to SoC 10 by, for example, 4 or more Gbps class high-speed signal wires. DRAM 12 and DRAM 13 are disposed close to SoC 10. It should be noted that it is possible to decrease the drive capability of an output buffer for high-speed signal by shortening a distance between DRAM 12 and DRAM 13 and SoC 10 to the limits.

Shunt resistors 14a and 14b are resistors for current detection each inserted (mounted) in series on a corresponding one of the power wires connecting PMIC 11 and DRAM 12. Moreover, shunt resistors 15a, 15b to 15m, and 15n are resistors for current detection each mounted in series on a corresponding one of the power wires connecting SoC 10 and PMIC 11. Shunt resistors 16a and 16b are resistors for current detection each inserted (mounted) in series on a corresponding one of the power wires connecting PMIC 11 and DRAM 13.

As stated above, shunt resistors 14a to 15n are each mounted in series on a corresponding one of the power wires connecting the power management IC and the semiconductor chips. It should be noted that the reason why the shunt resistors are used as the resistors for current detection is that it is intended to minimize consumed power of a circuit provided to semiconductor package 1 for power measurement.

Selector 17 outputs, to the outside via two output terminals 18 and 19, voltages at the both ends of a shunt resistor selected from among shunt resistors 14a to 15n. Selector 17 is, for example, a multiplexer.

In the present embodiment, selector 17 is selectably connected to wires extended from the both ends of respective shunt resistors 15a, 15b to 15m, and 15n

Selector 17 outputs, to two output terminals 18 and 19, voltages at the both ends of a shunt resistor selected from among shunt resistors 15a, 15b to 15m, and 15n. More specifically, SoC 10 or communication from the outside of semiconductor package 1 causes selector 17 to sequentially select shunt resistors 15a, 15b to 15m, and 15n one by one. Selector 17 outputs one of the voltages at the both ends of the shunt resistor selected to output terminal 18 that is one of two output terminals 18 and 19, and the other of the voltages at the both ends to output terminal 19 that is the other of two output terminals 18 and 19.

It should be noted that selector 17 needs ms order to select the next shunt resistor and output voltages at the both ends of the shunt resistor selected to two output terminals 18 and 19, that is, to switch voltage selection. However, it is sufficient that power necessary for thermal design is power measured at time intervals greater than ms order, and there is no problem with calculation.

Two output terminals 18 and 19 are terminals for outputting, to the outside of semiconductor package 1, voltage values at the both ends of a shunt resistor selected by selector 17. Two output terminals 18 and 19 each include a solder ball.

Since this makes it possible to output, to the outside of semiconductor package 1, the voltage values at the both ends of the shunt resistor selected by selector 17, it is possible to calculate consumed power of a desired power system from a known resistance value of the shunt resistor selected and the voltage values at the both ends of the shunt resistor selected.

[Advantageous Effects Etc.]

As described above, semiconductor package 1 according to the present embodiment makes it possible to select, with selector 17, voltage values at the both ends of a shunt resistor inserted in series into a power wire of SoC 10 and output the voltage values via two solder balls to the outside.

Hereinafter, a comparative example will be described.

Figure 2:
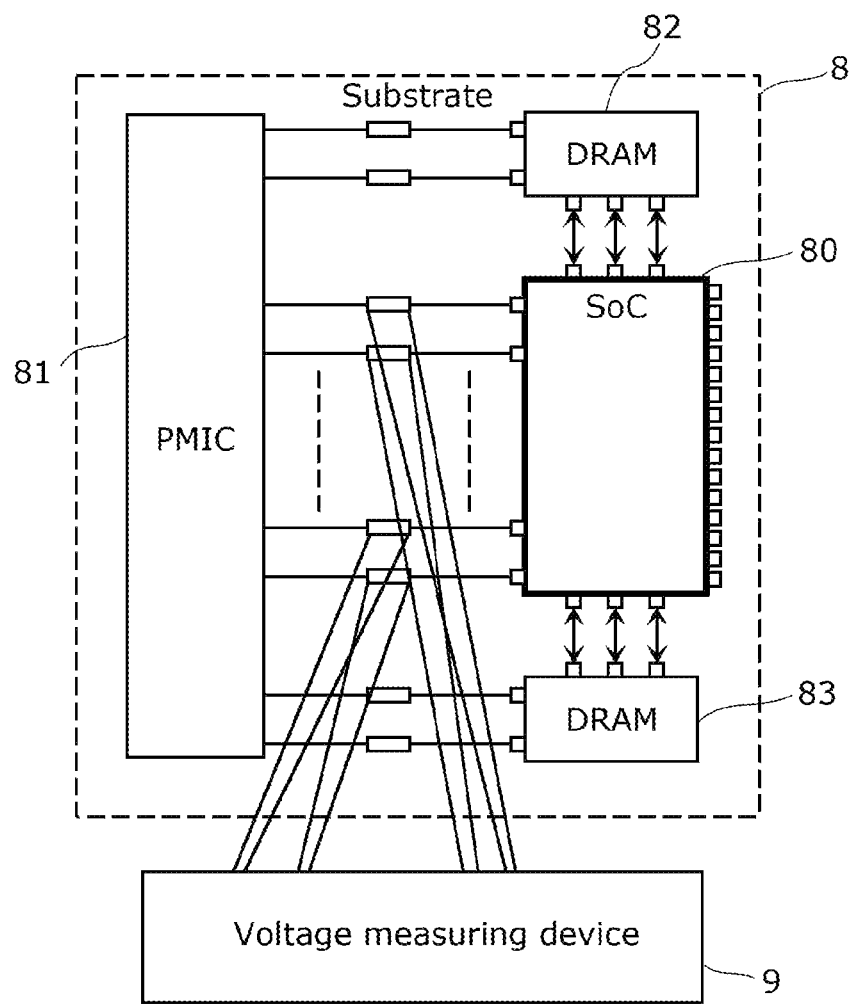
FIG. 2 is a diagram illustrating an example of a configuration of a mounting substrate according to a comparative example.

FIG. 2 is a diagram illustrating an example of a configuration of a mounting substrate according to the comparative example.

FIG. 2 shows, as the comparative example, a configuration in which semiconductor chips such as SoC 80 are mounted on substrate 8 such as a printed board. More specifically, FIG. 2 shows substrate 8 on which SoC 80, PMIC 81, DRAM 82, DRAM 83, and shunt resistors are mounted. PMIC 81, DRAM 82, DRAM 83, and the shunt resistors are disposed in the same positions as in the example shown in FIG. 1. It should be noted that since PMIC 81, DRAM 82, DRAM 83, and the shunt resistors are equivalent to PMIC 11, DRAM 12, DRAM 13, and shunt resistors 14a to 16b described above, respectively, description thereof will be omitted. In the comparative example, PMIC 81, DRAM 82, DRAM 83, and the shunt resistors are mounted on substrate 8.

When power measurement is performed on SoC 80, voltage measuring device 9 is prepared outside substrate 8 and is connected to the both ends of shunt resistors inserted in series into power wires between SoC 80 and PMIC 81. By causing voltage measuring device 9 to measure a voltage drop value in each of the shunt resistors in this manner, it is possible to calculate a current in the shunt resistor. As a result, since it is possible to calculate consumed power in each of the power wires between SoC 80 and PMIC 81, it is possible to perform power measurement on SoC 80 by adding up the consumed power. It should be noted that although not shown, voltage measuring device 9 contains a multiplexer and an A/D converter.

However, when PMC 81, DRAM 82, DRAM 83, and the shunt resistors are formed into a SiP, the power wires between PMIC 81 and SoC 80 are sealed and enclosed inside the SiP. For this reason, there is no means to measure the power of SoC 80 inside the SiP, and it is not possible to measure the power of SoC 80 inside the SiP.

In response, as shown in FIG. 1, the present embodiment makes it possible to sequentially select and output voltages at the both ends of a shunt resistor by including selector 17 inside the SiP.

More specifically, semiconductor package 1 according to the present embodiment includes: a plurality of semiconductor chips that include SoC 10 in which a plurality of integrated circuits including a processor core and a microcomputer are integrated on a single chip; PMIC 11 for performing power management on the plurality of semiconductor chips; a plurality of shunt resistors each of which is mounted in series on a different one of power wires connecting PMIC 11 and the plurality of semiconductor chips; two output terminals 18 and 19; and selector 17 that outputs voltages at both ends of a shunt resistor to an outside via two output terminals 18 and 19, the shunt resistor being selected from among the plurality of shunt resistors. PMIC 11, the plurality of semiconductor chips, the plurality of shunt resistors, and selector 17 are mounted inside a single package.

In this manner, semiconductor package 1 according to the present embodiment makes it possible to sequentially select and output voltages at the both ends of a shunt resistor by including selector 17 and shunt resistors that consume less power as circuits for power measurement.

In consequence, it is possible to not only address an increase in the number of IOs of the SoC the performance of which is enhanced, without narrowing the pitches of solder balls that are the output terminals, but also measure consumed power of a desired power system outside semiconductor package 1.

Accordingly, semiconductor package 1 according to the present embodiment makes it possible to measure the consumed power of SoC 10 while minimizing the consumed power of the circuit for power measurement.

It should be noted that the consumed power inside SoC 10 is dominant in the consumed power of semiconductor package 1, which is the SiP. For this reason, although the embodiment has described the configuration capable of causing selector 17 to output the voltages at the both ends of shunt resistors 15*a*, 15*b* to 15*m*, and 15*n*, and measuring the consumed power of SoC 10 in order to perform thermal design of a system including semiconductor package 1, the present disclosure is not limited to this configuration. Moreover, the consumed power of DRAMs 12 and 13 can be also measured by causing selector 17 to output the voltages at the both ends of shunt resistors 14*a*, 14*b*, 16*a*, and 16*b*. As a result, it is possible to measure the consumed power of all the power wires supplied from PMIC 11. It should be noted that it is possible to measure the consumed power of entire semiconductor package 1 by measuring the consumed power of the power wires supplied to semiconductor package 1. A difference between the consumed power of all the power wires supplied from PMIC 11 and the consumed power of entire semiconductor package 1 is the consumed power of PMIC 11.

Variation 1

Although selector 17 outputs the voltages at the both end of the shunt resistor selected to the outside of semiconductor package 1 via output terminals 18 and 19 by outputting the voltages at the both ends of the shunt resistor selected in the aforementioned embodiment, the present disclosure is not limited to this example.

For example, a PMIC 11-side voltage value that is one of voltages at the both ends of a shunt resistor and a voltage difference between the both ends may be outputted to the outside of semiconductor package 1 via output terminals 18 and 19. Hereinafter, this example will be described as Variation 1. It should be noted that the following mainly describes differences from the aforementioned embodiment.

Figure 3:
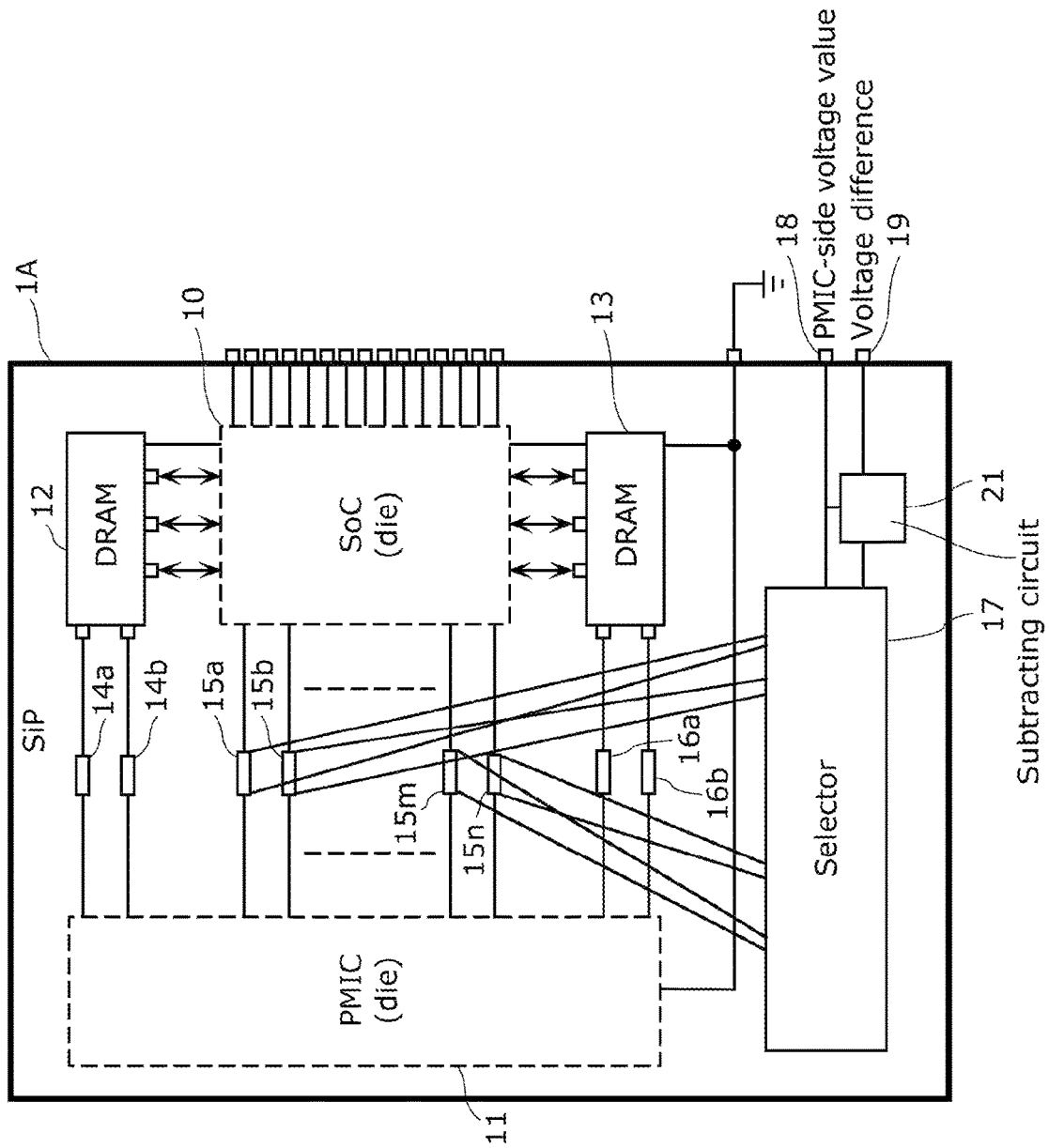
FIG. 3 is a diagram illustrating an example of a configuration of semiconductor package 1A according to Variation 1.

FIG. 3 is a diagram illustrating an example of a configuration of semiconductor package 1A according to Variation 1. The same reference signs are assigned to the same elements as in FIG. 1, and detailed description thereof will be omitted.

Semiconductor package 1A shown in FIG. 3 differs from semiconductor package 1 according to the aforementioned embodiment in further including subtracting circuit 21.

Subtracting circuit 21 is a subtracting circuit mounted between selector 17 and a first output terminal that is one of two output terminals 18 and 19 and to which a voltage difference between the both ends of a shunt resistor selected by selector 17 is outputted. Subtracting circuit 21 calculates a voltage difference between the both ends of a shunt resistor selected by selector 17, by subtracting a SoC 10-side voltage from a PMIC 11-side voltage that is one of voltages at the both ends of the shunt resistor.

In the present variation, as shown in FIG. 3, for example, subtracting circuit 21 is mounted between selector 17 and output terminal 19. Output terminal 19 corresponds to the first output terminal. Subtracting circuit 21 calculates a voltage difference between the both ends of a shunt resistor selected by selector 17, by subtracting a SoC 10-side voltage obtained from selector 17 from a PMIC 11-side voltage outputted to output terminal 18 from selector 17. Subtracting circuit 21 outputs the calculated voltage difference to output terminal 19.

It should be noted that subtracting circuit 21 is a circuit that outputs a voltage difference between two input voltages, and may be implemented as, for example, a circuit that performs inverting amplification and non-inverting amplification simultaneously, performs subtraction on two input voltages, and outputs a result of the subtraction. Moreover, a PMIC 11-side voltage is a voltage of PMIC 11 supplied to a power wire on which a shunt resistor selected by selector 17 is mounted. A SoC 10-side voltage is a voltage after a shunt resistor selected by selector 17 causes a voltage drop of a voltage of PMIC 11 supplied to a power wire on which the shunt resistor is mounted.

Selector 17 outputs, to a second output terminal that is one of two output terminals 18 and 19, a PMIC 11-side voltage that is one of voltages at the both ends of a shunt resistor selected, and outputs, to subtracting circuit 21, a SoC 10-side voltage that is the other of the voltages at the both ends of the shunt resistor selected. In the present variation, selector 17 outputs, to output terminal 18, a PMIC 11-side voltage that is one of voltages at the both ends of a shunt resistor selected, and outputs, to subtracting circuit 21, a SoC 10-side voltage that is the other of the voltages at the both ends of the shunt resistor selected.

In this manner, selector 17 is capable of outputting, to the outside via two output terminals 18 and 19, the voltage difference between the both ends of the shunt resistor selected, and the PMIC-side voltage that is one of the voltages at the both ends of the shunt resistor selected.

As stated above, semiconductor package 1A according to the present variation makes it possible to output the PMIC 11-side voltage of the shunt resistor sequentially selected and the voltage difference between the both ends of the shunt resistor.

Accordingly, semiconductor package 1A according to the present variation makes it possible to measure the consumed power of SoC 10 while minimizing the consumed power of the circuit for power measurement. Moreover, compared to a case in which voltages at the both ends of a shunt resistor are outputted, since semiconductor package 1A suppresses noise due to output of a voltage difference at a low voltage, semiconductor package 1A makes it possible to measure the consumed power of SoC 10 accurately.

Variation 2

Although selector 17 outputs the voltages at the both end of the shunt resistor selected to the outside of semiconductor package 1 via output terminals 18 and 19 by outputting the voltages at the both ends of the shunt resistor selected in the aforementioned embodiment, the present disclosure is not limited to this example.

For example, a PMIC 11-side voltage value that is one of voltages at the both ends of a shunt resistor and a voltage difference between the both ends may be outputted to the outside of semiconductor package 1 via output terminals 18 and 19. Hereinafter, this example will be described as Variation 2. It should be noted that the following mainly describes differences from the aforementioned embodiment.

Figure 4:
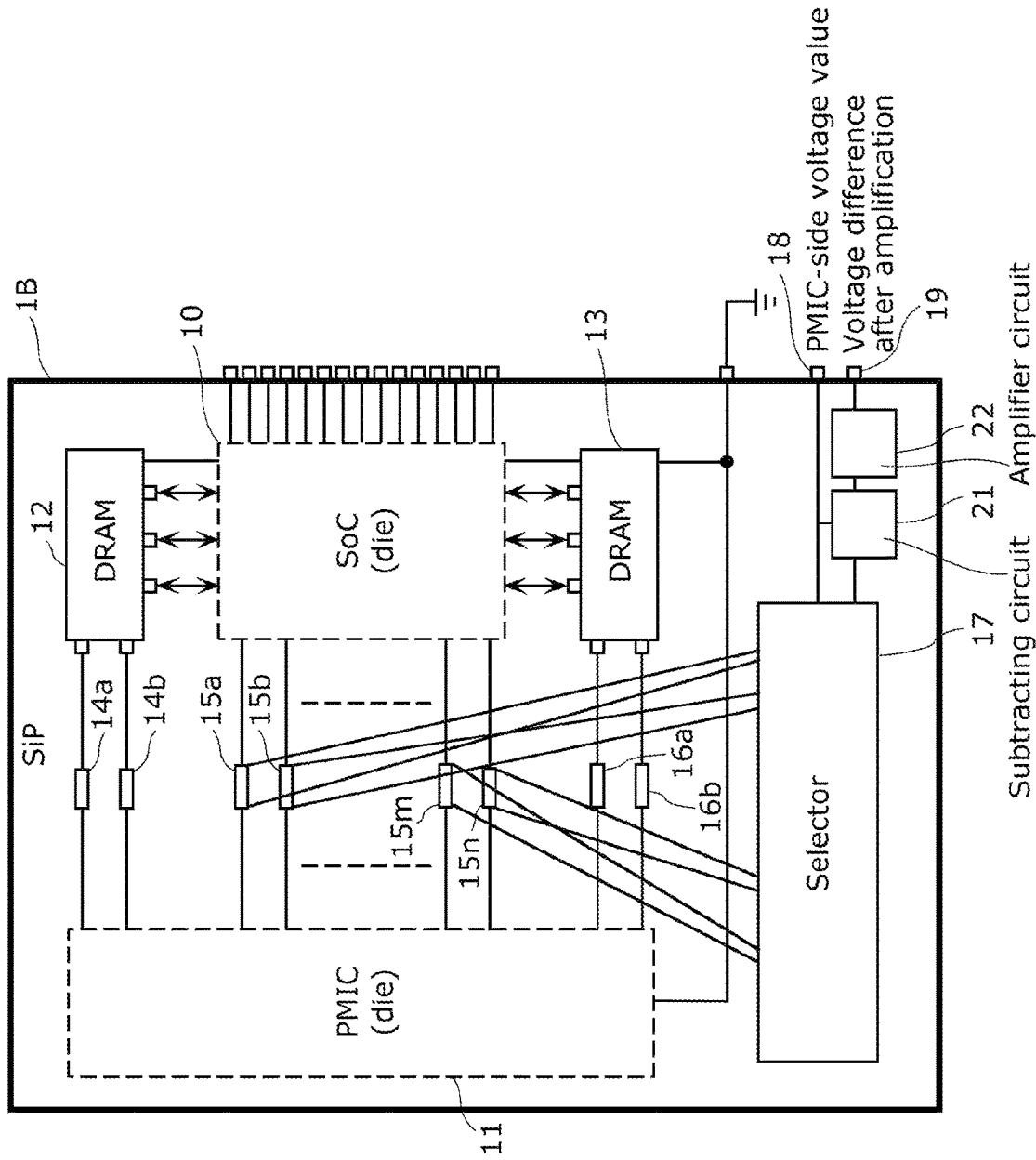
FIG. 4 is a diagram illustrating an example of a configuration of semiconductor package 1B according to Variation 2.

FIG. 4 is a diagram illustrating an example of a configuration of semiconductor package 1B according to Variation 2. The same reference signs are assigned to the same elements as in FIG. 1, and detailed description thereof will be omitted.

Semiconductor package 1B shown in FIG. 4 differs from semiconductor package 1 according to the aforementioned embodiment in further including subtracting circuit 21 and amplifier circuit 22.

Subtracting circuit 21 is a subtracting circuit mounted between selector 17 and a first output terminal that is one of two output terminals 18 and 19 and to which a voltage difference between the both ends of a shunt resistor selected by selector 17 is outputted. Subtracting circuit 21 calculates a voltage difference between the both ends of a shunt resistor selected by selector 17, by subtracting a SoC 10-side voltage from a PMIC 11-side voltage that is one of voltages at the both ends of the shunt resistor.

In the present variation, as shown in FIG. 4, for example, subtracting circuit 21 is mounted between selector 17 and output terminal 19 and between selector 17 and amplifier circuit 22. Output terminal 19 corresponds to the first output terminal. Subtracting circuit 21 calculates a voltage difference between the both ends of a shunt resistor selected by selector 17, by subtracting a SoC 10-side voltage obtained from selector 17 from a PMIC 11-side voltage outputted to output terminal 18 from selector 17. Subtracting circuit 21 outputs the calculated voltage difference to amplifier circuit 22.

Amplifier circuit 22 is mounted between selector 17 and the first output terminal that is one of two output terminals 18 and 19 and to which a voltage obtained by amplifying a voltage difference between the both ends of a shunt resistor selected by selector 17 is outputted. Amplifier circuit 22 amplifies the voltage difference calculated by subtracting circuit 21, and outputs the amplified voltage difference to the first output terminal.

In the present variation, as shown in FIG. 4, for example, amplifier circuit 22 is mounted between selector 17 and output terminal 19 and between subtracting circuit 21 and output terminal 19. Amplifier circuit 22 amplifies a voltage difference between the both ends of a shunt resistor selected by selector 17, the voltage difference being calculated and outputted by subtracting circuit 21. Amplifier circuit 22 outputs the amplified voltage difference to output terminal 19.

Selector 17 outputs, to a second output terminal that is one of two output terminals 18 and 19, a PMIC 11-side voltage that is one of voltages at the both ends of a shunt resistor selected, and outputs, to subtracting circuit 21, a SoC 10-side voltage that is the other of the voltages at the both ends of the shunt resistor selected. In the present variation, selector 17 outputs, to output terminal 18, a PMIC 11-side voltage that is one of voltages at the both ends of a shunt resistor selected, and outputs, to subtracting circuit 21, a SoC 10-side voltage that is the other of the voltages at the both ends of the shunt resistor selected.

In this manner, selector 17 is capable of outputting, to the outside via two output terminals 18 and 19, the voltage obtained by amplifying the voltage difference between the both ends of the shunt resistor selected, and the PMIC-side voltage that is one of the voltages at the both ends of the shunt resistor selected.

As stated above, semiconductor package 1B according to the present variation makes it possible to output the PMIC 11-side voltage of the shunt resistor sequentially selected, and the voltage obtained by amplifying the voltage difference between the both ends of the shunt resistor.

Accordingly, semiconductor package 1B according to the present variation makes it possible to measure the consumed power of SoC 10 while minimizing the consumed power of the circuit for power measurement. Moreover, compared to a case in which voltages at the both ends of a shunt resistor are outputted, since semiconductor package 1B not only suppresses noise but also amplifies and outputs a small value obtained as a result of taking a difference as measures against noise, semiconductor package 1B makes it possible to measure the consumed power of SoC 10 accurately.

It should be noted that the present disclosure has stated that shunt resistors, each of which is a current detection resistor, and a selector are included in a SiP in order to measure the power of an SoC that is a specific device in the SiP, the present disclosure is not limited to this example. A power measurable SiP for measuring the power of an SoC may use any configuration of the present disclosure, and a SiP having no need of power measurement such as a mass-produced item need not include a selector and may include shunts having 0Ω. A mass-produced SiP capable of predicting the power behavior of an SoC may be formed by causing the mass-produced SiP to include the same layout configuration as the power measurable SiP.

While various embodiments have been described herein above, it is to be appreciated that various changes in form and detail may be made without departing from the spirit and scope of the present disclosure as presently or hereafter claimed.

Further Information about Technical Background to this Application

The present application is based on and claims priority of Japanese Patent Application No. 2022-018028 filed on Feb. 8, 2022.

INDUSTRIAL APPLICABILITY

The present disclosure is applicable to a semiconductor package such as a SiP installed in a vehicle, and especially to a semiconductor package used for a car navigation system, a drive recorder, or an in-vehicle terminal.

The invention claimed is:

1. A semiconductor package comprising:
   a plurality of semiconductor chips that includes a system on chip (SoC) in which a plurality of integrated circuits including a processor core and a microcomputer are integrated on a single chip;
   a power management integrated circuit (IC) for performing power management on the plurality of semiconductor chips;

a plurality of shunt resistors each of which is mounted in series on a different one of power wires connecting the power management IC and the plurality of semiconductor chips;

two output terminals; and a single selector that outputs voltages at both ends of a shunt resistor to an outside via the two output terminals, the shunt resistor being selected from among the plurality of shunt resistors, wherein the power management IC, the plurality of semiconductor chips, the plurality of shunt resistors, and the single selector are mounted inside a single package.

2. The semiconductor package according to claim 1, wherein the single selector outputs a voltage difference between the both ends of the shunt resistor selected and a voltage on a power management IC side to the outside via the two output terminals, the voltage on the power management IC side being, among the voltages at the both ends of the shunt resistor, a voltage of the power management IC that is supplied to a power wire on which the shunt resistor selected is mounted.

3. The semiconductor package according to claim 2, comprising:

a subtracting circuit that is mounted between the single selector and a first output terminal to which the voltage difference is outputted, the first output terminal being one of the two output terminals, wherein the single selector:

outputs the voltage on the power management IC side to a second output terminal that is a remaining one of the two output terminals and is different from the first output terminal; and outputs the voltage difference to the first output terminal by outputting, to the subtracting circuit, a voltage on a semiconductor chip side among the voltages at the both ends of the shunt resistor selected, and the subtracting circuit calculates the voltage difference by subtracting the voltage on the semiconductor chip side from the voltage on the power management IC side.

4. The semiconductor package according to claim 1, wherein the single selector outputs, to the outside via the two output terminals, a voltage on a power management IC side and a voltage obtained by amplifying a voltage difference between the both ends of the shunt resistor selected, the voltage on the power management IC side being, among the voltages at the both ends of the shunt resistor, a voltage of the power management IC that is supplied to a power wire on which the shunt resistor selected is mounted.

5. The semiconductor package according to claim 4, comprising:

a subtracting circuit and an amplifier circuit that are mounted between the single selector and a first output terminal to which the voltage obtained by amplifying the voltage difference is outputted, the first output terminal being one of the two output terminals, wherein the single selector:

outputs the voltage on the power management IC side to a second output terminal that is a remaining one of the two output terminals and is different from the first output terminal; and outputs the voltage obtained by amplifying the voltage difference by outputting, to the subtracting circuit, a voltage on a semiconductor chip side among the voltages at the both ends of the shunt resistor selected, the subtracting circuit calculates the voltage difference by subtracting the voltage on the semiconductor chip side from the voltage on the power management IC side, and the amplifier circuit amplifies the voltage difference calculated by the subtracting circuit, and outputs the voltage difference amplified to the first output terminal.

6. The semiconductor package according to claim 1, wherein the plurality of semiconductor chips include a dynamic random-access memory (DRAM).

* * * * *